United States Patent
Vaccari

(10) Patent No.: US 6,168,961 B1
(45) Date of Patent: Jan. 2, 2001

(54) PROCESS FOR THE PREPARATION OF EPITAXIAL WAFERS FOR RESISTIVITY MEASUREMENTS

(75) Inventor: Giovanni Vaccari, Trecate (IT)

(73) Assignee: MEMC Electronic Materials, Inc., St. Peters, MO (US)

(*) Notice: Under 35 U.S.C. 154(b), the term of this patent shall be extended for 0 days.

(21) Appl. No.: 09/082,933

(22) Filed: May 21, 1998

(51) Int. Cl.[7] .............................. H01L 21/66; G01R 31/26
(52) U.S. Cl. .............................. 438/16; 438/771; 438/788
(58) Field of Search ............................ 438/14, 17, 18, 438/771, 788

(56) References Cited

U.S. PATENT DOCUMENTS

| | | | |
|---|---|---|---|
| 4,101,830 | * 7/1978 | Greig | 324/158 |
| 4,360,964 | * 11/1982 | Gilly et al. | 29/574 |
| 4,507,334 | 3/1985 | Goodman | 427/93 |
| 4,584,886 | 4/1986 | Matsunaga et al. | 73/863 |
| 4,749,440 | 6/1988 | Blackwood et al. | 156/646 |
| 4,900,395 | 2/1990 | Syverson et al. | 156/639 |
| 4,973,563 | 11/1990 | Prigge et al. | 437/225 |
| 5,181,985 | 1/1993 | Lampert et al. | 156/635 |
| 5,186,192 | 2/1993 | Netsu et al. | 134/68 |
| 5,232,870 | * 8/1993 | Ito et al. | 438/445 |
| 5,275,667 | 1/1994 | Ganesan et al. | 134/1 |
| 5,332,445 | 7/1994 | Bergman | 134/3 |
| 5,418,397 | * 5/1995 | Ogawa | 257/750 |
| 5,449,925 | * 9/1995 | Baliga et al. | 257/77 |
| 5,480,492 | 1/1996 | Udagawa et al. | 134/2 |
| 5,500,081 | * 3/1996 | Bergman | 156/646.1 |
| 5,661,408 | 8/1997 | Kamieniecki et al. | |
| 5,700,703 | * 12/1997 | Huang et al. | 438/186 |
| 5,872,017 | * 2/1999 | Boydston et al. | 438/17 |

FOREIGN PATENT DOCUMENTS 0 634 790 A2  12/1994  (EP).
3-220744   1/1990  (JP).

OTHER PUBLICATIONS

"Standard Test Method for Determining Net Carrier Density Profiles in Silicon Wafers by Capacitance–Voltage Measurements with a Mercury Probe", American Society for Testing and Materials (ASTM), Designatioin F1392–93, pp. 601–613.*

American Society for Testing and Materials, XP–002111978 F1392–93 Standard Test method for Determining Net Carrier Density Profiles in Silicon Wafers by Capacitance–Voltage Measurements with a Mercury Probe, Dated 1999.

American Institute of Physics; Deep–level transient spectroscopy of HF–cleaned and sulfur–passivated InP metal/nitride/semiconductor structures, Apr. 1, 1994, 6 pages.

Y. Nemirowsky et al., "UV Photon Assisted Control of Interface Charge Between CdTe Substrates and Metalorganic Chemical Vapor Deposition CdTe Epilayers" Journal of Electronic Materials, vol. 22, No. 8 (Aug 1993) pp. 977–983.

* cited by examiner

Primary Examiner—Richard Booth
(74) Attorney, Agent, or Firm—Senniger, Powers, Leavitt & Roedel

(57) ABSTRACT

The present invention is directed to a process for evaluating a silicon wafer having a n-type or a p-type epitaxial layer on the surface thereof. In a first embodiment, an oxide layer is formed on the surface of a n-type epitaxial wafer by exposing the wafer to ultraviolet light while in the presence of oxygen. The wafer is then subjected to a capacitance-voltage measurement to evaluate the characteristics of the epitaxial layer. In a second embodiment, an oxide layer is dissolved from the surface of a p-type epitaxial wafer by passing a gaseous mixture comprising an inert carrier gas and hydrofluoric acid vapors over the surface of the wafer. The wafer is then subjected to a capacitance-voltage measurement to evaluate the characteristics of the epitaxial layer.

13 Claims, 3 Drawing Sheets

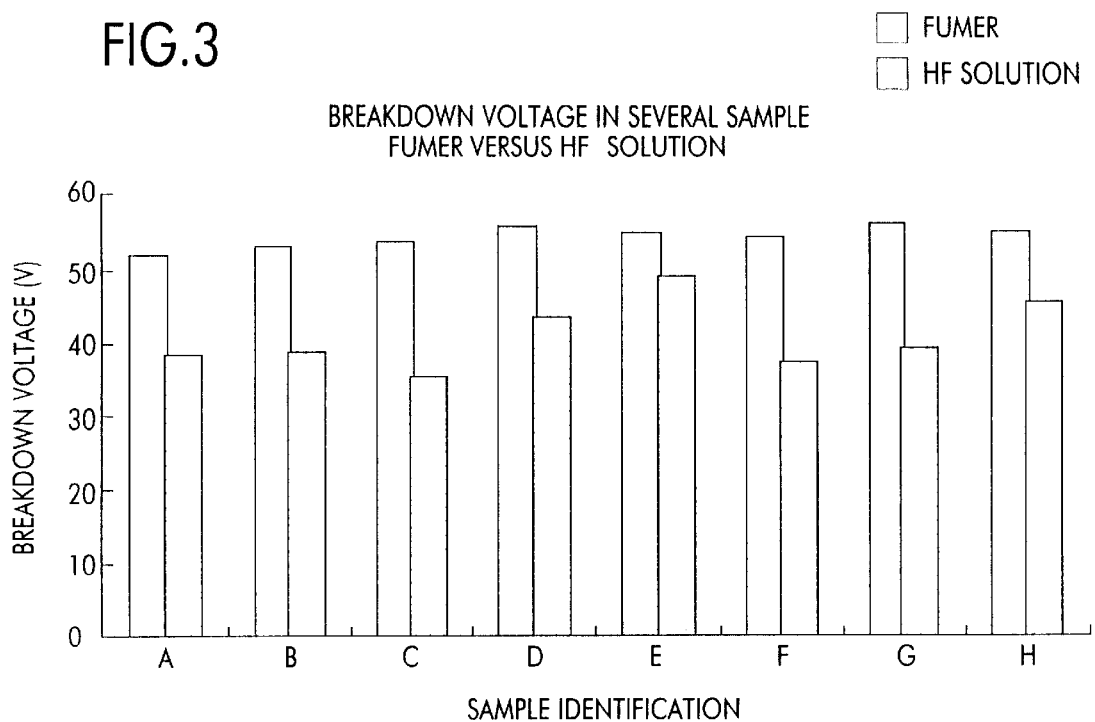

PROCESS FOR THE PREPARATION OF EPITAXIAL WAFERS FOR RESISTIVITY MEASUREMENTS

BACKGROUND OF THE INVENTION

The present invention relates generally to a process for preparing epitaxial wafers for analysis and, more particularly, to a process for the preparation of a surface of a p-type or a n-type epitaxial semiconductor wafer for capacitance-voltage measurements.

Semiconductor wafers suitable for the fabrication of integrated circuits are produced by slicing thin wafers from a single crystal silicon ingot. After slicing, the wafers undergo a lapping process to give them a somewhat uniform thickness. The wafers are then etched to remove damage and produce a smooth surface. The final step in a conventional wafer shaping process is a polishing step to produce a highly reflective and damage-free surface on at least one face of the wafer. It is upon this polished face that electrical device fabrication takes place.

The performance of electrical devices fabricated from silicon wafers can be enhanced through epitaxial deposition. Epitaxial deposition is the process of growing a thin crystalline layer on a crystalline substrate. For example, a lightly doped silicon epitaxial layer can be grown over a heavily doped silicon substrate wafer. Such a structure allows for high device operating speeds at moderate currents. Other advantages of epitaxy include precise control of dopant concentration profiles and freedom from impurities.

The epitaxial layer is deposited by placing a substrate wafer in an epitaxial reactor and then introducing into that reactor by means of a carrier gas, such as hydrogen, one of a number of silicon-based compounds, including $SiCl_4$, $SiHCl_3$, or $SiH_2Cl_2$. Once the desired operating conditions are achieved, silicon deposition occurs as the result of a reaction between the silicon-based compound and the hydrogen carrier gas which produces hydrochloric acid and pure silicon. The silicon which is produced is then deposited on the substrate wafer surface. Deposition may continue until an epitaxial layer of the desired thickness has been grown.

After epitaxial layer deposition is complete, typically certain characteristics of the wafer are evaluated at or near the intended device region of the wafer. Epitaxial layer characteristics such as dopant concentration profile, resistivity, slope, flat zone, etc. are indications of the quality of the layer. These epitaxial layer characteristics are most commonly measured by capacitance-voltage ("CV") techniques which involve first preparing a Schottky diode.

Preparation of a Schottky diode involves forming an electrical circuit by means of two contacts with the surface of the material to be tested. Typically, a Schottky diode comprises contacting the silicon wafer with a column of liquid mercury on the epitaxial layer side and with a metal plate, such as a steel plate, on the non-epitaxial side. These contacts may be formed using conventional instrumentation and methods, including the "front side down" method (see, e.g., MSI instrument, commercially available from MSI) and the "back side down" method (see, e.g., SSM instrument, commercially available from Solid State Measurement).

Capacitance-voltage measurements are performed by continuously changing the applied potential to the surface of the wafer. Experience has shown that the surface state of the wafer to be tested may strongly influence the properties of the Schottky diode used for the CV measurements. This influence is primarily due to the fact that majority carriers present in the wafer may flow through, or migrate across, the junction which is formed at the mercury-silicon interface of thus diode. As a result, the reliability of the measurement may be compromised. To prevent this migration from occurring, the junction must be maintained in a rectifying state. Typically, this rectifying state is achieved by chemically treating the wafer surface by means common in the art (see, e.g., ASTM Recommendation F1392).

The method of chemical treatment employed depends upon the type of wafer to be treated. For example, for a n-type wafer, chemical treatment typically involves forming, or growing, a thin oxide layer on the wafer surface. Oxide layer growth is typically achieved by immersing the wafer for several minutes in a solution containing an oxidizing agent, such as nitric acid, hot hydrogen peroxide or ozonated water. The wafer is then rinsed in deionized water for about 10 minutes and spun dry in an atmosphere of nitrogen.

For a p-type wafer, chemical treatment typically involves either treating the wafer for about 30 seconds in a concentrated HF solution, or treating the wafer for about 5 minutes in a dilute HF solution (such as, for example, a solution of 1 part HF to 10 parts water). The wafer is then rinsed for about 10 minutes with deionized water and spun dry in an atmosphere of nitrogen.

These current methods of preparing the surface of a n-type or p-type epitaxial wafer are problematic for a number of reasons. First, the use of highly acidic solutions poses safety hazards in a production environment and the vapors which result from heating such solutions are harmful to surrounding equipment. Second, throughput is decreased because these methods are time consuming, primarily due to the fact that these are "wet bench" methods requiring wafer drying before further processing can be performed. Third, expensive equipment is required to handle solutions of this kind and to obtain adequate surface preparation. Lastly, in the case of p-type wafer preparation, large quantities of hydrofluoric acid are consumed which significantly adds to the expense of the process.

In view of the foregoing, a need continues to exist for an efficient and cost-effective process by which to prepare the surface of a n-type or a p-type wafer, such that accurate and consistent CV measurements may be obtained. The ability to accurately and efficiently monitor the performance of epitaxial reactors in a continuous manner is critical to the production of epitaxial wafers because, if the wafers being produced have unacceptable dopant concentration profiles, the epitaxial reactor can be adjusted to prevent the further production of such unacceptable wafers.

SUMMARY OF THE INVENTION

Among the objects of the present invention, therefore, are the provision of an improved process for evaluating the characteristics of a silicon wafer having a n-type or a p-type epitaxial layer on the surface thereof; the provision of such a process wherein the wafer surface which is to be evaluated is not wetted; and, the provision of a process for preparing a n-type or a p-type epitaxial wafer for capacitance-voltage measurements which allows for increased safety, efficiency, and cost effectiveness.

Briefly, therefore, the present invention is directed to a process for evaluating a silicon wafer having a n-type or a p-type epitaxial layer on the surface thereof. In a first embodiment, an oxide layer is formed on the surface of a n-type epitaxial wafer by exposing the wafer to ultraviolet light while in the presence of oxygen. The wafer is then subjected to a capacitance-voltage measurement to evaluate the characteristics of the epitaxial layer.

The present invention is further directed to a process for evaluating surface characteristics of a silicon wafer having a n-type epitaxial layer on the surface thereof. Ozone and atomic oxygen are formed by irradiating an oxygen-containing atmosphere with ultraviolet light, the ultraviolet light having wavelengths of about 185 nm and about 254 nm. A n-type epitaxial wafer is exposed to the ozone and atomic oxygen to form a silicon oxide layer on a surface of the wafer. The wafer is then subjected to a capacitance-voltage measurement to evaluate the characteristics of the epitaxial layer.

The present invention is further directed to a process for evaluating surface characteristics of a silicon wafer having a n-type epitaxial layer on the surface thereof. The process comprises forming a silicon oxide layer on top of the epitaxial layer by exposing the wafer to ultraviolet light while in the presence of oxygen, the ultraviolet light having wavelengths of about 185 nm and about 254 nm. The surface characteristics are then evaluated by preparing a Schottky diode, in which a first contact between the silicon oxide and mercury, and a second contact between a metal and a non-epitaxial side of the wafer are formed.

The present invention is still further directed to a process, in a second embodiment, for evaluating a silicon wafer having a p-type epitaxial layer on the surface thereof. The process comprises placing the wafer in a treatment chamber. An inert carrier gas is bubbled through an acid trap containing an aqueous hydrofluoric acid solution to enrich the carrier gas with hydrofluoric acid vapors and form a gaseous mixture comprising the carrier gas and hydrofluoric acid. The gaseous mixture is transferred to the treatment chamber and allowed to contact the wafer surface to dissolve a silicon oxide layer. The wafer is then subjected to a capacitance-voltage measurement to evaluate the epitaxial layer.

Other objects and features of this invention will be in part apparent and in part pointed out hereinafter.

BRIEF DESCRIPTION OF THE DRAWINGS

FIG. 3 is a graph showing the Schottky diode breakdown voltage results for two different p-type epitaxial silicon wafers, as described in Example 2.

DETAILED DESCRIPTION OF THE PREFERRED EMBODIMENTS

Figure 1:
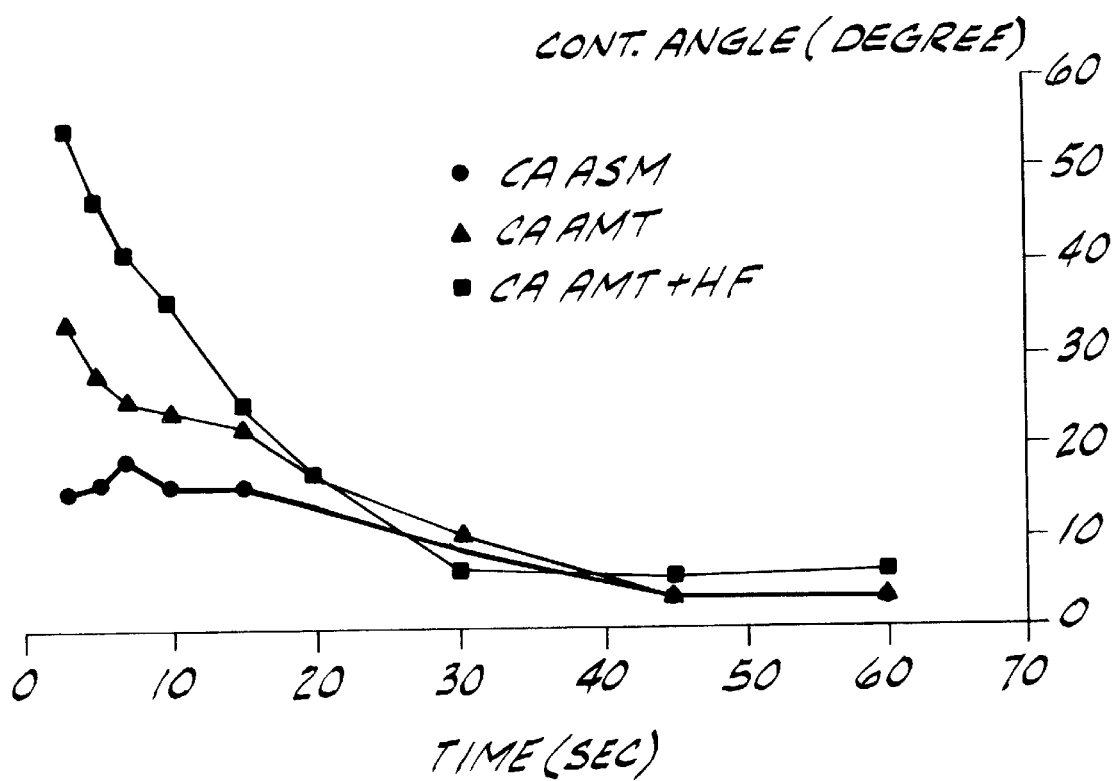
FIG. 1 is a graph showing the change in the contact angle versus treatment time for different n-type epitaxial silicon wafers, on the surfaces of which were grown oxide layers as describe in Example 1.

In accordance with the process of the present invention, n-type and p-type epitaxial single crystal silicon wafers are prepared for evaluation of epitaxial layer characteristics by capacitance-voltage (CV) measurements. It is to be understood that, as used herein, the term "p-type" refers to a semiconductor in which holes are the dominant carriers. Similarly, the term "n-type" is to be understood to represent a semiconductor in which electrons are the dominant carriers.

Epitaxial layer characteristics generally include dopant concentration profile, resistivity, slope, and flat zone, all of which are indications of the quality of the layer. These epitaxial layer characteristics are most commonly measured by capacitance-voltage ("CV") techniques in which a Schottky diode is prepared. In a first embodiment of the present invention, a n-type epitaxial wafer is prepared for evaluation by growing an oxide layer on the wafer surface. In a second embodiment of the present invention, a p-type epitaxial wafer is prepared for evaluation by dissolving an oxide layer from the wafer surface.

In the first embodiment, a n-type epitaxial wafer is prepared for capacitance-voltage (CV) measurements by exposing the wafer to ultraviolet (UV) light in the presence of an oxygen-containing atmosphere to oxidize a surface of the wafer. Without being held to any particular theory, it is believed that, upon being exposed to UV light, oxygen ($O_2$) reacts to form ozone ($O_3$) and atomic oxygen (O) by absorbing UV light having a wavelength of about 185 nm. Once formed, the ozone may undergo further decomposition to form additional atomic oxygen by absorbing UV light having a wavelength of about 254 nm. The atomic oxygen which is generated acts as a particularly strong oxidizing agent. Both the atomic oxygen and the ozone may react with the silicon on the wafer surface to form an oxide layer.

The rate at which the oxide layer is formed on the surface of the n-type wafer is, at least in part, a function of the distance between the wafer surface and the UV source, the rate increasing as the distance decreases. Without being held to any particular theory, it is believed this is primarily due to the initial formation of an oxygen radical, which is far more reactive as compared to atomic oxygen or ozone. If the distance between the UV source and the wafer surface is minimal, the electrons of the radical may remain at an excited energy level for a time sufficient to react with the wafer surface, as opposed to reacting to form ozone or relaxing to a lower energy level to form atomic oxygen. As a result, the surface of the wafer will typically be placed at a distance from the UV source ranging from about 1 mm to about 10 mm, and preferably from about 2 mm to about 5 mm.

As noted, atomic oxygen is a particularly good oxidizing agent for the silicon wafer. As a result, the UV source will typically be adjusted to emit light at the requisite wavelengths in a proportion which optimizes atomic oxygen production. Typically, therefore, the UV source will emit about 50 percent of its UV energy at about 185 nm, and about 50 percent of its UV energy at about 254 nm. Preferably, however, about 65 percent of the UV energy emitted will be at a wavelength of about 185 nm, while about 35 percent of the UV energy emitted will be at a wavelength of about 254 nm.

Upon UV irradiation of the oxygen-containing atmosphere, the n-type epitaxial wafer will typically be exposed to the atomic oxygen and ozone that are formed for about 30 seconds to about 60 seconds. Preferably, however, the wafer will be exposed only for a duration which is sufficient to produce an oxide layer that is acceptable for obtaining accurate and consistent CV measurements. It is to be noted in this regard that the wafer may be exposed for a much longer period of time. However, a longer period of exposure is believed to be unnecessary and may simply act to reduce the process throughput.

Any UV source common to the art which is capable of emitting UV light at the requisite wavelengths, uniformly across the entire surface of the wafer, may be used for the present process. Preferably, however, a low pressure mercury vapor grid lamp, having an output of about 20,000 microwatts/$cm^2$, will be used (commercially available from the Jelight Company, Inc.).

The process of the present invention may be carried out at any temperature which allows for the formation of an acceptable oxide layer by means of UV irradiation of an oxygen-containing atmosphere. Preferably, however, the process will be carried out at room temperature, ranging from about 20° C. to about 25° C.

Preferably, the first embodiment of the present invention is performed using an ultraviolet oxidation machine ("UVO machine"), which is commercially available from the Jelight Company, Inc. (located in Irvine, Calif.; model # 144A). The UVO machine is preferred because it may generally be used with little modification to form an oxide layer on the surface of a n-type silicon wafer, and it offers a number of features which are favorable to this first embodiment. For example, two interlocks, one at the initial wafer inlet and a second at the UV irradiation chamber, act to prevent operator exposure to UV energy during wafer treatment. In addition, the machine uses air as a process gas and, therefore, the only facilities necessary for operation are electrical power and an exhaust, which allows for ozone to be purged from the reaction chamber before the wafer is removed. Finally, although the machine is typically configured for processing only one wafer, the throughput can be increased using convention methods of modification to enable the machine to process multiple wafers at one time.

In a second embodiment of the present process, the preparation of a p-type epitaxial wafer for capacitance voltage (CV) measurements is achieved by dissolving an oxide layer from a surface of the wafer by exposing the wafer to a carrier gas which has been enriched with hydrofluoric acid (HF) vapors. It is to be noted in this regard that, in theory, an oxide layer should not be present on the surface of a p-type wafer after it exits the epitaxial reactor. If the p-type wafer is not immediately subjected to CV measurements, however, a native oxide layer may form (i.e., an oxide layer which forms as a result of the wafer being exposed only to the oxygen present in the air after exiting the epitaxial chamber). Furthermore, it has been found that even if the wafer is tested immediately after removal from the reactor, it may not be possible to determine some or all of the characteristics of the wafer. Under these circumstances, treating the wafer in accordance with the present invention is preferred to improve the accuracy and reliability of the CV measurements.

According to this second embodiment, the p-type epitaxial wafer is placed in a treatment chamber having a controlled environment and prepared of a material suitable for exposure to HF vapors. Preferably, the chamber is first purged with an inert, non-oxidizing gas, such as nitrogen, to remove any oxidizing agents which may be present. Typically, the chamber will be purged using nitrogen gas having a flow rate ranging from about 50 to about 150 standard cubing feet per hour (SCFH). Preferably, the flow rate will range from about 90 to about 110 SCFH. The duration of the nitrogen purge may vary with the size of the chamber and the number of cubic feet to be purged. Typically, the purge will continue for about 5 to about 10 seconds. Preferably, however, the purge will only be performed for a duration which is sufficient to remove any oxidizing agents and other impurities which are present.

A carrier gas, typically nitrogen, is enriched with HF vapors by passing, or "bubbling," the nitrogen through an acid trap containing an aqueous solution of HF. As the gas bubbles through the acidic solution, HF vapors become entrained in the gas stream, forming a gaseous mixture comprising HF and the carrier gas. The HF vapors are thus transported by the gas into the treatment chamber.

Typically, the carrier gas flow rate through the trap will range from about 50 to about 150 SCFH. Preferably, the flow rate will range from about 90 to about 110 SCFH. It is to be noted in this regard that, if the flow rate becomes too great, HF vapors may condense and droplets of HF may form on the interior of the treatment chamber. This may be harmful to the equipment as well as to the overall process if these droplets contact the surface of the wafer, and should therefore be avoided.

The acidic solution will typically have a HF concentration of at least about 40 percent by weight. Preferably, the HF concentration will range from about 40 percent to about 50 percent by weight. Most preferably, the HF solution will be as concentrated as safety concerns and equipment designs and materials will allow. However, it is to be noted that the process may be successfully performed using a solution having a HF concentration which is less than about 40 percent by weight. However, as the solution becomes more dilute, the rate at which the oxide layer is dissolved from the wafer surface may decrease and therefore longer exposure times may be required. In addition, the solution may become so dilute that HF vapors cannot efficiently be obtained.

The duration over which the p-type epitaxial wafer will typically be exposed to the HF enriched gas is a function both of the concentration of the HF solution being used, as well as the thickness of the oxide layer to be removed. Typically, for a solution having a HF concentration between about 40 percent and about 50 percent by weight and a native oxide layer ranging in thickness from about 2 angstroms to about 50 angstroms, the exposure time will be about 20 to about 25 seconds. However, as the solution becomes more or less concentrated, the exposure time may decrease or increase, respectively. In addition, for a solution of a given concentration, as the oxide layer increases or decreases in thickness, the exposure duration may also increase or decrease, respectively.

After the HF enriched gas enters the treatment chamber and passes over the wafer surface, it may exit the chamber through an exhaust tube. When the wafer has been exposed to the gas for the desired length of time, the treatment chamber is preferably purged with the inert carrier gas. This final purge step preferably lasts about 20 to about 30 seconds and is performed as a safety precaution to prevent an operator from coming into contact with any HF vapors or residue which may have been left behind. As a result, it is to be noted that as the size, or volume, of the treatment chamber increases, the purge time may also increase.

It is to be noted that as the exposure time increases, the HF vapors may become "spent;" that is, the vapors may be fully consumed by the reaction with the oxide layer on the wafer surface. Thus, in a preferred embodiment, if the wafer is to be exposed for more than about 25 seconds, the treatment chamber will be purged for a short period of time to remove the spent HF vapors. In this way, fresh HF vapors will be introduced to the chamber and increased efficiency of the process will result. This intermediate purge preferably lasts about 10 seconds and is performed after every 25 seconds of HF exposure. Thus, depending on the duration of the HF exposure, more than one intermediate purge step may be necessary. For example, if the HF treatment lasts for about 50 seconds, an intermediate purge step is performed after about 25 seconds, and a final purge step is performed when the HF treatment is complete.

It is to be noted that the process of the second embodiment has the option that, if desired, only the front side, i.e. the epitaxial side, of the wafer may be treated. This process is advantageous over conventional techniques, wherein the wafer is immersed in a solution, because process time is reduced. If, however, only one side of the wafer is treated, the "back side down" method of CV measurement is preferably used because, due to the size of the metal contact, the method is less sensitive to the presence of an oxide layer on the back side of the wafer. As a result, problems such as parasitic capacitance and serial resistance will not adversely affect the CV measurements.

Preferably, the process of the second embodiment will be carried out using the FUMER dry HF machine, which is commercially available from SEZ (located in Villach, Austria). The FUMER is preferred because it may generally be used with little modification, under the standard operating conditions specified by the manufacturer, to dissolve an oxide layer from the surface of a p-type epitaxial wafer.

The process of the second embodiment may be performed on multiple wafers at one time to increase process throughput. The exact number of wafers to be processed is a function of the size of wafer holder and the treatment chamber, as well as the diameter of the wafers being treated.

It is to be noted that, for a p-type epitaxial wafer with an epitaxial layer having a resistivity of less than about 3 ohm-cm, the p-type wafer may be treated with UV for about 2 to about 5 seconds. This it done to improve the accuracy of the measurement. Without being held to any particular theory, it is believed that this thin oxide layer is helpful in removing organic residues and other contaminants present on the surface of the wafer. When an oxide layer is grown, it is preferred that the wafer will be treated in accordance with the process of the first embodiment of the present invention. Preferably, therefore, the p-type wafer is placed below a UV lamp in the presence of an oxygen-containing atmosphere and the surface is oxidized by exposing it to the resulting ozone and atomic oxygen that is generated for between about 2 and about 5 seconds.

Wafers prepared in accordance with the first embodiment may be evaluated by conventional means to determine the presence of an oxide layer on the wafer surface. For example, contact angle measurements are often used to detect the presence of an oxide layer and are based on the principle that the oxygen terminated surface of the wafer is hydrophilic. Contact angle measurements involve measuring the angle a drop of water produces when it contacts the wafer surface. As an oxide layer is grown on the wafer surface, the surface becomes less hydrophobic and thus the contact angle decreases.

The embodiments of the present invention provide the means by which to obtain accurate CV measurements by enabling an improved process for preparing the surface of n-type and p-type epitaxial wafers in such a way that, upon the formation of a Schottky diode, a junction may be maintained in a rectifying state. The present invention allows for wafer surface preparation to be carried out in a dry environment which, as compared to conventional wet bench methods, is more efficient and results in a more cost-effective process to manufacture and evaluate epitaxial wafers. As disclosed in the examples that follow, wafers prepared in accordance with the present invention were evaluated using conventional "back side down" and "front side down" CV measurement methods and instrumentation (see, e.g., SSM instrument and MSI instrument, respectively), and found to be of a quality generally better than that of wafers prepared by a standard "wet bench" method.

The present invention is illustrated by the following examples which are merely for the purpose of illustration and are not to be regarded as limiting the scope of the invention or manner in which it may be practiced.

EXAMPLE 1

UV Oxidation of n-type Epitaxial Wafers

The process of the first embodiment of the present invention was performed on three sets of n-type epitaxial single crystal silicon wafers, each having a hydrophobic surface. Each set of was prepared in a different way; that is, the epitaxial layer was grown on each set of wafers in a different way. The first set of n-type epitaxial wafers were prepared using an Applied Material epitaxial reactor. The second of wafers were prepared using an ASM epitaxial reactor. Finally, the third set of wafers were prepared using an Applied Materials reactor, but after the wafers were removed from the reactor, they were treated with hydrofluoric acid to dissolve any oxide layer present and ensure complete hydrogen termination of the surfaces (i.e., the wafer surfaces were free of any native oxide layer).

Using a conventional UVO machine, (available from Jelight Company, model # 144A), a wafer from each set was positioned in the wafer holder such that the distance between the UV lamp and the surface of the wafer was about 10 mm. Power was supplied to the UV lamp within the UVO machine to generate UV light at wavelengths of about 185 nm and 254 nm, in a proportion of 65 percent to 35 percent, respectively. Ambient air was utilized as the oxygen-containing atmosphere.

The duration of exposure was increased from one wafer to the next in each set to examine the formation of an oxide layer as a function of exposure time. These wafers were then analyzed by ellipsometer, to evaluate the change in wafer thickness, and by contact angle, to evaluate the hydrophilicity of the wafer surface. Referring now to FIG. 1, the contact angle was then plotted as a function of the exposure time. As can be seen from FIG. 1, the contact angle decreases as the exposure time increases, indicating that an oxide layer is being grown. It is to be noted that each data point given for the contact angle was determined after averaging the results of 9 measurements taken at different positions on the surface of each wafer. This was done to ensure the results were representative of the entire wafer surface.

As previously stated, as an oxide layers forms on the surface of a wafer (i.e., as the surface becomes more hydrophilic), the contact angle decreases. As can be seen from the above plot, the contact angle of the wafers subjected to the present process decreased greatly over the first 60 seconds of exposure.

It is to be noted that the contact angle obtained after about 30 seconds of exposure is about equal to that obtained using conventional, "wet bench," methods. In this regard it is to be further noted that such wet bench methods typically take 3 minutes or more to form such an oxide layer, and then require additional time to rinse and dry the wafer before CV measurements can be taken. As a result, process time is greatly reduced by the present invention.

EXAMPLE 2

Dissolution of Oxide Layer Using HF Vapors

A p-type epitaxial silicon wafer was positioned inside the FUMER dry HF machine, commercially available from SEZ (located in Villach, Austria). The treatment chamber was first purged for about 5 seconds with nitrogen gas at a flow rate of about 100 SCFH.

A stream of nitrogen gas was then passed, or "bubbled," through an aqueous solution having about a 40 percent by weight concentration of hydrofluoric acid (HF) at a flow rate of about 100 SCFH. The nitrogen gas was enriched with HF vapors, and then this HF enriched stream of gas was directed to the treatment chamber and passed over the surface of the wafer.

The wafer was exposed to the HF enriched gas for about 20 seconds, during which time the HF vapors acted to dissolve the native oxide layer present on the surface of the wafer. After the treatment was complete, a stream of nitrogen gas was passed through the chamber for about 20 seconds to purge the chamber of any HF vapors which remained.

Using the surface charge option of a conventional SPV tool, commercially available from SDI (model # CMS4020), the frequency dispersion and the barrier height of the treated wafer were determined and compared to another p-type epitaxial silicon wafer which had been surface treated by a standard "wet bench" HF solution method.

Frequency dispersion is the curve obtained by measuring the surface charge when a laser chopping frequency is changed in the range of 10 to 40000 Hz. The shape of this curve is used to evaluate the presence of contaminants on the surface of the wafer, and can also be used to evaluate the quality of the epitaxial layer on the wafer surface.

The curve typically comprises two different parts, or sections. The first part is usually flat up to the medium frequency range (i.e., the range of about 10 to about 50 Hz), and then it begins to decrease. The second part is usually a curve that decreases with a high slope, the slope being higher than for the latter portion of the curve (i.e., the portion of the curve beginning at about 500 Hz). The presence of a high slope in this latter portion of the curve, which typically ranges from about 500 to about 5000 Hz or more, is typically associated with the existence of a "slow state," which is an indication that the surface of the wafer is unacceptable.

Figure 2:
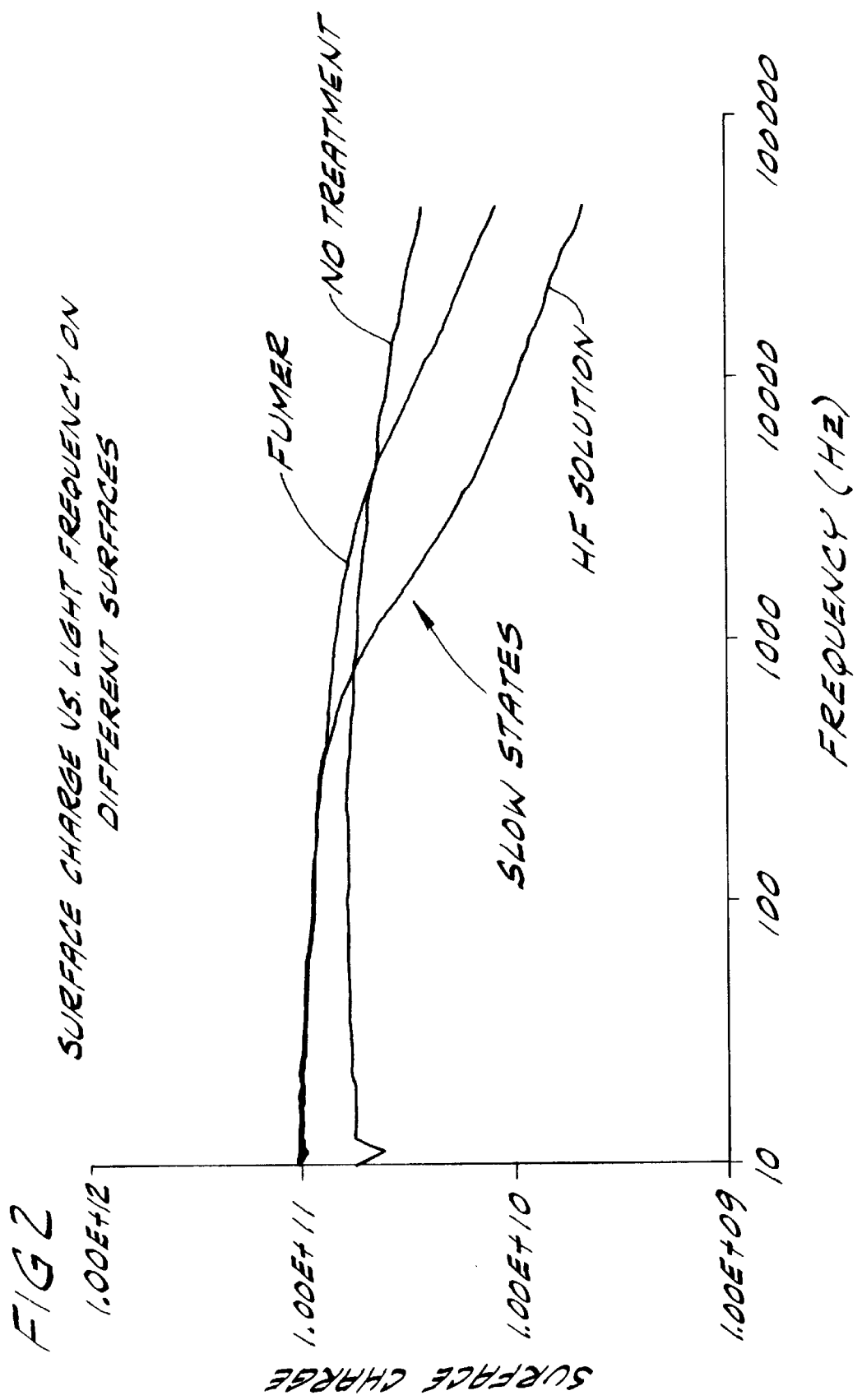
FIG. 2 depicts the frequency dispersion curves for three different p-type epitaxial silicon wafers, as described in Example 2.

Referring now to FIG. 2, the frequency dispersion curves obtained on the two surface treated wafers, as well as a third untreated wafer, are depicted.

From these results it can be seen that initially the HF vapor treatment is similar to the wet bench HF method. However, the wafer prepared by the wet bench process clearly has a slope which is much more significant in the latter portion of the curve (i.e., the portion ranging from about 2000 to about 40000 Hz), as compared to the wafer subjected to the present process. Thus, the surface of the wafer prepared by the present process is of a higher quality.

Referring now to FIG. 3, the two surface treated wafers were also repeatedly evaluated for breakdown voltage of a Schottky diode. It is known in the art that a higher value corresponds to a higher quality rectifying junction and, therefore, a higher quality in the surface of the wafer.

As can be seen from FIG. 3, the breakdown voltage for the wafer treated using HF vapors is noticeably higher than for the wafer treated using conventional wet bench methods. It can also be seen that the measurement for the wafer treated by the present process is significantly more reproducible as compared to the measurement for the conventionally treated wafer.

In view of the above, it will be seen that the several objects of the invention are achieved. As various changes could be made in the above processes without departing from the scope of the invention, it is intended that all matter contained in the above description be interpreted as illustrative and not in a limiting sense.

What is claimed is:

1. A process for evaluating a silicon wafer having a n-type epitaxial layer on the surface thereof, the process comprising:

oxidizing the surface of the wafer by exposing the wafer to ultraviolet light in an oxygen-containing atmosphere; and subjecting the oxidized wafer to a capacitance-voltage measurement to evaluate the n-type epitaxial layer.

2. The process as set forth in claim 1 wherein the ultraviolet light has wavelengths of about 185 nm and about 254 nm.

3. The process as set forth in claim 1 wherein the wafer is subjected to said capacitance-voltage measurement to evaluate characteristics of the n-type epitaxial layer selected from the group consisting essentially of resistivity, dopant concentration, slope, and flat zone.

4. The process as set forth in claim 1 wherein the wafer is exposed to the ozone and atomic oxygen by positioning the wafer from about 2 mm to about 5 mm from an ultraviolet light source.

5. The process as set forth in claim 1 wherein the ultraviolet light source emits about 65 percent of its energy at about 185 nm, and about 35 percent of its energy at about 254 nm.

6. A process for evaluating surface characteristics of a n-type epitaxial silicon wafer by capacitance-voltage measurements, the wafer having an epitaxial side and a non-epitaxial side, the process comprising:

forming an oxide layer on the epitaxial side of the wafer by exposing the wafer to ultraviolet light while in the presence of oxygen; and, preparing a Schottky diode by forming a first contact between the oxide layer and a mercury column, and a second contact between a metal and the non-epitaxial side of the wafer.

7. The process as set forth in claim 6 wherein the wafer is subjected to said capacitance-voltage measurement to evaluate characteristics of the n-type epitaxial layer selected from the group consisting essentially of resistivity, dopant concentration, slope, and flat zone.

8. The process as set forth in claim 6 wherein the wafer is exposed to the ozone and atomic oxygen by positioning the wafer from about 2 mm to about 5 mm from the ultraviolet light source.

9. The process as set forth in claim 6 wherein the ultraviolet light source emits about 65 percent of its energy at about 185 nm, and about 35 percent of its energy at about 254 nm.

10. A process for evaluating a silicon wafer having a p-type epitaxial layer on the surface thereof, the wafer having an epitaxial side and a non-epitaxial side, the process comprising:

placing the wafer in a treatment chamber;

bubbling an inert carrier gas through an acid trap containing an aqueous hydrofluoric acid solution to enrich the carrier gas with hydrofluoric acid vapors and form a gaseous mixture comprising the carrier gas and hydrofluoric acid;

transferring the gaseous mixture to the treatment chamber and exposing the wafer to the mixture, the hydrofluoric acid acting to dissolve an oxide layer present on the epitaxial side of the wafer; and subjecting the exposed wafer to a capacitance-voltage measurement to evaluate the p-type epitaxial layer.

11. The process as set forth in claim 10 wherein the wafer is subjected to said capacitance-voltage measurement to evaluate characteristics of the p-type epitaxial wafer selected from the group consisting essentially of resistivity, dopant concentration, slope, and flat zone.

12. The process as set forth in claim 10 wherein the wafer is exposed to the gaseous mixture for about 20 to about 30 seconds.

13. The process as set forth in claim 10 wherein the p-type epitaxial wafer has a resistivity of less than about 3 ohm*cm, and wherein after the oxide layer is dissolved from the wafer surface, the surface is reoxidized prior to subjecting the wafer to a capacitance-voltage measurement.

* * * * *